United States Patent
Sato et al.

(10) Patent No.: US 7,156,912 B2
(45) Date of Patent: Jan. 2, 2007

(54) COLORED COMPOSITION

(75) Inventors: Takeshi Sato, Tokyo (JP); Atsushi Nishida, Tokyo (JP)

(73) Assignee: Toyo Ink Mfg. Co., Ltd., Tokyo (JP)

( * ) Notice: Subject to any disclaimer, the term of this patent is extended or adjusted under 35 U.S.C. 154(b) by 0 days.

(21) Appl. No.: 11/290,511

(22) Filed: Dec. 1, 2005

(65) Prior Publication Data

US 2006/0118001 A1 Jun. 8, 2006

(30) Foreign Application Priority Data

Dec. 3, 2004 (JP) .......................... P2004-350740

(51) Int. Cl.
C09B 67/16 (2006.01)
C09B 67/18 (2006.01)
C09B 67/22 (2006.01)

(52) U.S. Cl. .................. 106/413; 106/410; 106/412; 524/88

(58) Field of Classification Search ............... 106/410, 106/412, 413; 524/88
See application file for complete search history.

(56) References Cited

U.S. PATENT DOCUMENTS

| | | | |
|---|---|---|---|
| 2,291,452 A | | 7/1942 | Dahlen et al. |
| 2,791,589 A | * | 5/1957 | Pugin ..................... 540/141 |
| 2,873,279 A | * | 2/1959 | Randall et al. ............ 540/123 |
| 3,252,991 A | * | 5/1966 | Schmidt et al. ............ 540/132 |
| 3,320,276 A | * | 5/1967 | Hamilton et al. .......... 540/137 |
| 3,424,759 A | * | 1/1969 | Hamilton et al. .......... 540/138 |
| 4,088,507 A | | 5/1978 | Tanaka et al. |
| 4,221,606 A | | 9/1980 | Funatsu et al. |
| 4,664,714 A | | 5/1987 | Katsura et al. |
| 5,282,896 A | * | 2/1994 | Tsuchida et al. .......... 106/411 |
| 5,912,283 A | * | 6/1999 | Hashizume et al. ........ 523/213 |

2005/0131114 A1 6/2005 Sunahara et al.

FOREIGN PATENT DOCUMENTS

| | | |
|---|---|---|
| DE | 1619639 | 3/1971 |
| GB | 555289 | 8/1943 |
| GB | 803525 | 10/1958 |
| GB | 929695 | 6/1963 |
| GB | 958081 | 5/1964 |
| GB | 1096013 | 12/1967 |
| GB | 1436911 | 5/1976 |
| JP | 52-132031 | 11/1977 |
| JP | 54-062227 | 5/1979 |
| JP | 56-061461 | 5/1981 |
| JP | 60-088185 | 5/1985 |
| JP | 63-305173 | 12/1988 |
| JP | 4-15265 A * | 1/1992 |
| JP | 9-043846 | 2/1997 |
| JP | 9-176511 | 7/1997 |
| JP | 10-338772 | 12/1998 |
| JP | 2004-117537 | 4/2004 |

OTHER PUBLICATIONS

English Language Abstract of JP 9-043846. (Feb. 1997).
English Language Abstract of JP 2004-117537. (Apr. 2004).
English Language Abstract of JP 63-305173. (Dec. 1988).
English Language Abstract of JP 56-061461. (May. 1981).
English Language Abstract of JP 9-176511. (Jul. 1997).
English Language Abstract of JP 10-338772. (Dec. 22, 1998).

* cited by examiner

*Primary Examiner*—Anthony J. Green
(74) *Attorney, Agent, or Firm*—Greenblum & Bernstein, P.L.C.

(57) ABSTRACT

A colored composition is disclosed that includes a pigment carrier, formed from a transparent resin, its precursor or a mixture thereof, and a halogenated phthalocyanine pigment that has been treated with a higher fatty acid. If required, this colored composition may also include a dye derivative with a basic group, and/or a dye derivative with an acidic group or a salt thereof.

12 Claims, No Drawings

COLORED COMPOSITION

CROSS REFERENCE TO RELATED APPLICATIONS

This Application is based upon and claims the benefit of priority from prior Japanese Application P2004-350740 filed on Dec. 3, 2004; the entire contents of which are incorporated by reference herein.

BACKGROUND OF THE INVENTION

1. Field of the Invention

The present invention relates to a colored composition, and more particularly to a colored composition that can be used in the formation of a coating film that exhibits favorable frequency characteristics and a favorably low dielectric loss tangent.

2. Description of the Related Art

In the production of printed circuit boards, solder resists are used to form a protective film that prevents the adhesion of solder to unnecessary portions of the circuit board during soldering steps.

In recent years, as the density of wiring on printed circuit boards has increased, demands have grown for a solder resist that is capable of forming an insulating film with favorable electrical properties.

However, with conventional solder resists comprising a phthalocyanine pigment, the formed coating film exhibits poor electrical properties, and the frequency characteristics and the variation in dielectric loss tangent are also unsatisfactory, meaning the use of such coating films as organic insulation materials is problematic (see Japanese Laid-Open Publication No. Hei 09-43846, Japanese Laid-Open Publication No. 2004-117537).

SUMMARY OF THE INVENTION

The present invention relates to a colored composition comprising a pigment carrier, formed from a transparent resin, its precursor or a mixture thereof, and a halogenated phthalocyanine pigment that has been treated with a higher fatty acid.

Because the halogenated phthalocyanine pigment contained within the colored composition of the present invention has been treated with a higher fatty acid, free halogen ions, which have a deleterious effect on the electrical properties, are not released within the colored composition. As a result, the coating film formed using this colored composition exhibits a lower and more favorable dielectric loss tangent variation than a coating film formed using a colored composition comprising a conventional phthalocyanine pigment. In addition, because this colored composition uses a pigment that has been treated with a higher fatty acid, a favorable dispersion state can be maintained, and the composition exhibits low viscosity, low thixotropic properties, and favorable storage stability (stability in the viscosity over time).

Accordingly, the present invention enables the provision of a colored composition, which comprises a phthalocyanine pigment and is capable of forming a coating film that exhibits excellent frequency characteristics and a particularly low variation in the dielectric loss tangent, and is consequently unlikely to impair electrical properties.

In addition, in order to cope with small-scale, high-density packaging, the invention also enables the provision of a colored composition that retains a favorable dispersion state, and exhibits favorable thixotropic properties and storage stability.

DETAILED DESCRIPTION OF THE EMBODIMENTS

As follows is a description of preferred embodiments of a colored composition of the present invention.

This colored composition comprises a pigment carrier, formed from a transparent resin, its precursor or a mixture thereof, and a halogenated phthalocyanine pigment that has been treated with a higher fatty acid (hereafter also referred to as simply the "treated pigment"). The treated pigment is preferably used in an amount of 30 to 70% by weight based on the weight of the nonvolatile fraction of the colored composition. In addition, the colored composition preferably also comprises a dye derivative with a basic group, and/or a dye derivative with an acidic group or a salt thereof.

First is a detailed description of the treated pigment.

The quantity of the treated pigment is preferably within a range from 30 to 70% by weight, and even more preferably from 40 to 55% by weight, based on the weight of the nonvolatile fraction of the colored composition.

Higher fatty acid treatment of the halogenated phthalocyanine pigment refers to a treatment in which the surface of the pigment is coated with the higher fatty acid. Simply mixing the higher fatty acid with the halogenated phthalocyanine pigment does not generate the desired improvement in the electrical properties and the like, but if the higher fatty acid is kneaded together with the halogenated phthalocyanine pigment, thereby coating the pigment surface with the higher fatty acid, then an improvement in the electrical properties and the like is achieved.

A halogenated phthalocyanine pigment is a pigment represented by a general formula (1) shown below, and specific examples include C.I. Pigment Green 7, 36, and 37.

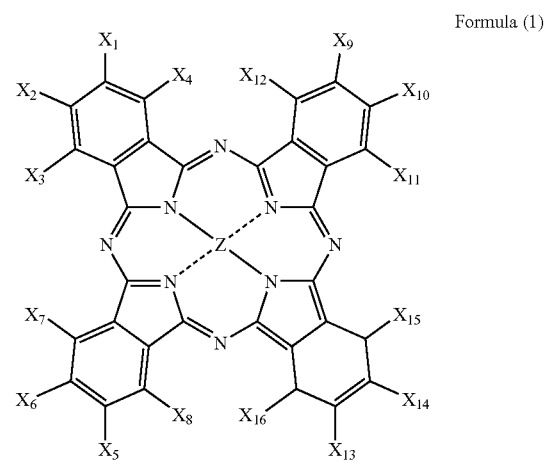

Formula (1)

(wherein, $X_1$ to $X_{16}$ each represent, independently, H, F, Cl, Br, or I, and at least one of the groups must represent a halogen atom. Z (the central metal) represents an element belonging to one of group 4 through group 14 of the periodic table.)

Examples of the central metal Z of the halogenated phthalocyanine pigment include Cu, Al, Co, Ni, Ti, and Zn.

The halogenated phthalocyanine pigment can use, for example, a pigment produced by halogenating crude phthalocyanine blue using a conventional method, and then dividing (pigmentizing) the resulting product to a suitable particle size (from 0.05 to 0.5 µm).

The central metal in crude phthalocyanine blue is copper, but halogenation of crude phthalocyanines with central metals other than copper can be conducted using the same method as that employed for crude phthalocyanine blue.

The higher fatty acid is a straight-chain (with no branching) monovalent carboxylic acid of large molecular weight, and can use either an unsaturated higher fatty acid or a saturated higher fatty acid. Examples of suitable unsaturated higher fatty acids include oleic acid, linoleic acid and linolenic acid. Examples of suitable saturated higher fatty acids include palmitic acid and stearic acid. Of these, oleic acid exhibits favorable compatibility with the pigment carrier, and is consequently preferred. The higher fatty acid can use either a single compound, or a mixture of two or more different compounds.

From the viewpoint of achieving a satisfactory improvement in the electrical properties, the treatment quantity of the higher fatty acid (the quantity of the higher fatty acid used in the treatment) is preferably at least 2 parts by weight per 100 parts by weight of the halogenated phthalocyanine pigment, whereas from the viewpoint of ensuring favorable coating adhesion, the treatment quantity is preferably no more than 15 parts by weight, and is even more preferably from 3 to 10 parts by weight.

The higher fatty acid treatment of the halogenated phthalocyanine pigment can be conducted by subjecting a mixture of the halogenated phthalocyanine pigment and the higher fatty acid to kneading using a salt milling process or dry milling process or the like. By kneading the mixture of the halogenated phthalocyanine pigment and the higher fatty acid, almost all of the higher fatty acid is adsorbed onto the surface of the halogenated phthalocyanine pigment.

A salt milling process is a process in which a mixture of the pigment, the higher fatty acid, a water-soluble inorganic salt and a water-soluble organic solvent are kneaded under heating using a kneader or the like, and the water-soluble inorganic salt and water-soluble organic solvent are then removed by water washing. The water-soluble inorganic salt functions as a crushing aid, and during the salt milling process, the high level of hardness of the inorganic salt is used to regulate the size of the pigment particles, and the resulting pigment aggregating energy is then used to cause adsorption of the higher fatty acid to the pigment surface. During salt milling of a pigment, heating must be used to accelerate the adjustment of the pigment particle size, and a heating temperature within a range from 70 to 150° C. is preferred. If the heating temperature falls outside the range from 70 to 150° C., the efficiency of the pigment size adjusting process is poor, that is, coating the pigment surface with the higher fatty acid requires considerable time, which is undesirable.

The water-soluble inorganic salt employed in the salt milling process includes sodium chloride, barium chloride, potassium chloride and sodium sulfate. Among them, the employment of sodium chloride is preferable in terms of cost. The quantity of the inorganic salt employed in the salt milling should preferably be 0.5 to 20 times, and even more preferably 1 to 10 times, the weight of the pigment, in view of the treatment efficiency and of productivity efficiency.

The water-soluble organic solvent serves to wet the pigment and the water-soluble inorganic salt. Use may be made of any water-soluble organic solvent, which can be dissolved in (or miscible with) water and which does not substantially dissolve the inorganic salt used. However, during the salt milling process, the temperature is increased to provide a condition under which a solvent is ready to evaporate. Thus, the solvent used preferably have a boiling point of as high as not less than 120° C. in view of safety.

Specific examples of such water-soluble organic solvent include, for example, 2-methoxy ethanol, 2-butoxy ethanol, 2-(isopentyloxy)ethanol, 2-(hexyloxy)ethanol, diethylene glycol, diethylene glycol monoethyl ether, diethylene glycol monobutyl ether, triethylene glycol, triethylene glycol monomethyl ether, liquid polyethylene glycol, 1-methoxy-2-propanol, 1-ethoxy-2-propanol, dipropylene glycol, dipropylene glycol monomethyl ether, dipropylene glycol monoethyl ether and liquid polypropylene glycol.

A dry milling process is a process in which the pigment and the higher fatty acid are subjected to dry grinding using a dry grinding apparatus such as a ball mill, an attritor or a vibration mill that is filled with grinding media such as beads or the like. The pigment particle size is adjusted as a result of the collisions and friction between the grinding media, and the pigment aggregating energy generated during this process is then used to cause adsorption of the higher fatty acid to the pigment surface. If required, dry milling may be conducted with the inside of the grinding apparatus either under reduced pressure, or filled with an inert gas such as nitrogen gas. Although there are no particular restrictions on the operating conditions for the dry grinding apparatus, in order to ensure that the coating of the pigment surface with the higher fatty acid proceeds effectively, the conditions described below are particularly preferred.

In those cases where the dry grinding apparatus is an attritor, the revolution speed of the apparatus is preferably within a range from 100 to 500 rpm, the dry grinding time is preferably from 0.5 to 8 hours, and the internal temperature of the apparatus is preferably from 50 to 150° C. Furthermore, the grinding media is preferably spherical with a diameter of 4 to 30 mm, and the quantity of media used is preferably from 5 to 50 times the weight of the pigment undergoing treatment.

In those cases where the dry grinding apparatus is a ball mill, the revolution speed of the apparatus is preferably within a range from 50 to 200 rpm, the dry grinding time is preferably from 1 to 12 hours, and the internal temperature of the apparatus is preferably from 30 to 100° C. The grinding media is preferably spherical with a diameter of 10 to 50 mm, and the quantity of media used is preferably from 5 to 50 times the weight of the pigment undergoing treatment.

The pigment carrier, in which the pigments are dispersed, is composed of a transparent resin, its precursor or a mixture thereof. The transparent resin exhibits a light transmittance of preferably 80% or more, more preferably 95% or more with respect to the whole visible wavelengths of 400 to 700 nm. The transparent resin includes a thermoplastic resin, a thermosetting resin and an active energy beam curable resin. Its precursor includes a monomer and an oligomer which produce the transparent resin upon curing by irradiation of active energy beam.

The transparent resin or precursor may be used singly, or in mixtures of two or more materials, namely, mixtures of two or more transparent resins, mixtures of two or more precursors, or mixtures of one or more transparent resins and one or more precursors.

The pigment carrier is preferably used in an amount of 20 to 70% by weight, and even more preferably from 30 to 55% by weight, based on the weight of the nonvolatile fraction of the colored composition.

Examples of the thermoplastic resin constituting the pigment carrier include a butyral resin, a styrene-maleic acid copolymer, a chlorinated polyethylene, a chlorinated polypropylene, a polyvinyl chloride, a vinyl chloride-vinyl acetate copolymer, a polyvinyl acetate, a polyurethane resin, a polyester resin, an acrylic resin, an alkyd resin, a styrene resin, a polyamide resin, a rubber resin, a cyclized rubber resin, a cellulose, a polyethylene (including HDPE and LDPE), a polybutadiene, and a polyimide resin.

Examples of the thermosetting resin include an epoxy resin, a benzoguanamine resin, a rosin modified maleic acid resin, a rosin modified fumaric acid resin, a melamine resin, a urea resin, and a phenolic resin.

Examples of the active energy beam curable resin include resins prepared by reacting a linear polymer having a reactive substituent such as hydroxyl, carboxyl or amino group with a (meth)acrylic compound having a reactive group such as isocyanato, aldehydo or epoxy group, or with cinnamic acid, thereby introducing a resultant photo-crosslinkable group such as (meth)acryloyl or styryl group into the linear polymer. Also, use may be made of a linear polymer having an acid anhydride, such as a styrene-maleic anhydride copolymer or an α-olefin-maleic anhydride copolymer which have been half esterified with a (meth) acrylic compound having a hydroxyl group, such as a hydroxyalkyl (meth)acrylate.

Examples of the monomer and oligomer constituting the pigment carrier include various acrylate esters and methacrylate esters such as methyl (meth)acrylate, ethyl (meth) acrylate, 2-hydroxyethyl (meth)acrylate, 2-hydroxypropyl (meth)acrylate, cyclohexyl (meth)acrylate, β-carboxyethyl (meth)acrylate, polyethylene glycol di(meth)acrylate, 1,6-hexanediol di(meth)acrylate, triethylene glycol di(meth) acrylate, tripropylene glycol di(meth)acrylate, trimethylolpropane tri(meth)acrylate, pentaerythrytol tri(meth)acrylate, 1,6-hexanediol diglycidyl ether di(meth)acrylate, bisphenol A diglycidyl ether di(meth)acrylate, neopentyl glycol diglycidyl ether di(meth)acrylate, dipentaerythrytol hexa(meth) acrylate, tricyclodecanyl (meth)acrylate, ester (meth)acrylate, (meth)acrylate of methylolated melamine, epoxy (meth)acrylate, and urethane acrylate; (meth)acrylic acid, styrene, vinyl acetate, hydroxyethyl vinyl ether, ethylene glycol divinyl ether, pentaerythrytol trivinyl ether, (meth) acrylamide, N-hydroxymethyl (meth)acrylamide, N-vinyl formamide, and acrylonitrile. These can be used singly or in combination.

When the colored composition is cured by ultraviolet irradiation, a photopolymerization initiator is added to the composition.

Examples of the photopolymerization initiator include acetophenone photopolymerization initiators such as 4-phenoxydichloroacetophenone, 4-t-butyl-dichloroacetophenone, diethoxyacetophenone, 1-(4-isopropylphenyl)-2-hydroxy-2-methylpropan-1-one, 1-hydroxycyclohexyl phenyl ketone, 2-benzyl-2-dimethylamino-1-(4-morphorinophenyl)-butan-1-one and 2-methyl-1-(4-(methylthio)phenyl)-2-morpholinopropan-1-one; benzoin photopolymerization initiators such as benzoin, benzoin methyl ether, benzoin ethyl ether, benzoin isopropyl ether and benzyl dimethyl ketal; benzophenone photopolymerization initiators such as benzophenone, benzoylbenzoic acid, methyl benzoylbenzoate, 4-phenylbenzophenone, hydroxybenzophenone, acrylated benzophenone and 4-benzoyl-4'-methyldiphenyl sulfide; thioxanthone photopolymerization initiators such as thioxanthone, 2-chlorothioxanthone, 2-methylthioxanthone, isopropylthioxanthone and 2,4-diisopylthioxanthone; triazine photopolymerization initiators such as 2,4,6-trichloro-s-triazine, 2-phenyl-4,6bis(trichloromethyl)-s-triazine, 2-(p-methoxyphenyl)-4,6-bis-(trichloromethyl)-s-triazine, 2-(p-tolyl)-4,6-bis(trichloromethyl)-s-triazine, 2-piperonyl-4,6-bis(trichloromethyl)-s-triazine, 2,4-bis(trichloromethyl)-6-styryl-s-triazine, 2-(naphtho-1-yl)-4,6-bis(trichloromethyl)-s-triazine, 2-(4-methoxy-naphtho-1-yl)-4,6-bis (trichloromethyl)-s-triazine, 2,4-trichloromethyl (piperonyl)-6-triazine and 2,4-trichloromethyl(4'-methoxystyryl)-6-triazine; borate photopolymerization initiators, carbazole photopolymerization initiators, and imidazole photopolymerization initiators. The photopolymerization initiator can be used singly or in combination.

The photopolymerization initiator can be used in an amount of 5 to 30% by weight, and preferably from 5 to 15% by weight, based on the weight of the nonvolatile fraction of the colored composition.

As a sensitizer, compounds such as α-acyloxy ester, acylphosphine oxide, methylphenyl glyoxylate, benzil, 9,10-phenanthrene quinone, camphor quinone, ethylanthraquinone, 4,4'-diethylisophthalophenone, 3,3',4,4'-tetra(t-butylperoxycarbonyl)benzophenone and 4,4'-diethylaminobenzophenone can be additionally used.

The sensitizer can be used in an amount of 0.1 to 30% based on the weight of the photopolymerization initiator.

The colored composition can be prepared by finely dispersing the treated pigment, together with the photopolymerization initiator as required, in the pigment carrier by various dispersing means such a three-roll mill, a two-roll mill, a sand mill, a kneader or an attritor.

When the treated pigments are dispersed in the pigment carrier, a dispersing aid such as a resin type dispersing agent (a resin type pigment dispersing agent), a dye derivative or a surfactant can be used.

The dispersing aid exhibits a powerful dispersing effect on the treated pigment, and a powerful effect for preventing reaggregation of the treated pigment in a dispersion, and consequently when the treated pigment is dispersed within the pigment carrier using a dispersing aid, a colored composition is obtained that exhibits excellent dispersibility, and particularly favorable storage stability and low thixotropic properties. The dispersing aid is preferably used in an amount of 3 to 20% by weight, and even more preferably from 5 to 15% by weight, based on the weight of pure pigment within the treated pigment.

Of the possible dispersing aids, a dye derivative with a basic group, or a dye derivative with an acidic group or a salt thereof generate a powerful treated pigment dispersing effect, and are consequently preferred.

A resin type dispersing agent adsorbs to the surface of the treated pigment using an acidic group or a basic group as an anchor, and the repulsive effect of the polymer then enables the dispersion stability to be favorably maintained, and consequently a polymer with an acidic group or basic group is preferred. Sulfone groups are preferred as the acidic group due to their superior adsorption properties, whereas amino groups are preferred as the basic group due to their superior adsorption properties. The use of a combination of a dye derivative with an acidic group and a resin type dispersing agent with a basic group, or a combination of a dye derivative with a basic group and a resin type dispersing agent with an acidic group is preferred in terms of the favorable compatibility with the pigment carrier.

As the resin type dispersing agent with an acidic group or a basic group, the use of a comb type polymer, having a structure in which branch polymer segments are grafted to a backbone polymer segment containing the acidic group or basic group, provides enhanced organic solvent solubility as a result of the superior steric repulsion effect of the branch polymer segments, and is consequently preferred. In addition, for the above reasons, a comb type polymer with a molecular structure in which at least two branch polymers are grafted to each backbone polymer molecule is particularly desirable. The branch polymers are preferably soluble in organic solvents.

Specific examples of basic resin type dispersing agents include polyethyleneimine, polyethylene polyamine, polyxylylene poly(hydroxypropylene) polyamine, poly (aminomethylated) epoxy resins, and copolymers of a glycidyl (meth)acrylate amine adduct and a (meth)acrylate esterified glycidyl (meth)acrylate. Examples of methods of synthesizing these polymers are described below.

Polyethyleneimine can be obtained by a ring-opening polymerization of ethyleneimine in the presence of an acid catalyst.

Polyethylene polyamine can be obtained by a polycondensation of ethylene dichloride and ammonia in the presence of an alkali catalyst.

Poly(aminomethylated) epoxy resins can be obtained by chloromethylating the aromatic ring of an epoxy resin such as a bisphenol A epoxy resin, bisphenol F epoxy resin, phenol novolak epoxy resin, cresol novolak epoxy resin, or naphthol novolak epoxy resin, and then conducting an amination, and these resins are also known as Mannich bases. Examples of the amine used in the amination include monomethylamine, monoethylamine, monomethanolamine, monoethanolamine, dimethylamine, diethylamine, dimethanolamine, and diethanolamine.

Copolymers of a glycidyl (meth)acrylate amine adduct and a (meth)acrylate esterified glycidyl (meth)acrylate can be obtained by polymerizing a glycidyl (meth)acrylate via a radical polymerization, conducting an addition of one of the same amines as those listed above to a portion of the epoxy groups within the formed polymer, thereby generating a poly(glycidyl (meth)acrylate amine adduct), and then conducting an esterification reaction of the remaining epoxy groups with the carboxylic acid of (meth)acrylic acid.

Specific examples of branched polymers that can be used within the basic resin type dispersing agent include poly (12-hydroxystearic acid), polyricinoleic acid, and ring-opening polymers of ε-caprolactone or the like, which are polymers with a carboxylic acid at the polymer terminal that are capable of forming graft bonds via amidation reactions with the amino groups of the aforementioned backbone polymers. In those cases where the backbone polymer contains vinyl groups, such as the case of the copolymers of a glycidyl (meth)acrylate amine adduct and a (meth)acrylate esterified glycidyl (meth)acrylate described above, examples of suitable branch polymers include polymers that are capable of graft polymerization to these vinyl groups, such as poly (methyl (meth)acrylate) and poly(ethyl (meth)acrylate). Examples of methods of synthesizing these polymers are described below.

Poly(12-hydroxystearic acid) can be obtained by a dehydration polycondensation polyesterification reaction of 12-hydroxystearic acid.

Similarly, polyricinoleic acid can be obtained by a dehydration polycondensation polyesterification reaction of ricinoleic acid.

Ring-opening polymers of ε-caprolactone can be obtained by adding the aliphatic monocarboxylic acid n-caproic acid to ε-caprolactone to initiate a ring-opening polymerization.

Specific examples of acidic resin type dispersing agents include the commercially available product series listed below.

(1) Products manufactured by BYK Chemie, including Anti-Terra-U (a phosphate salt of a polyaminoamide), Anti-Terra-203/204 (salts of high molecular weight polycarboxylic acids), Disperbyk-101 (a phosphate salt of a polyaminoamide and an acid ester), -107 (a hydroxyl group-containing carboxylate ester), -110 (a copolymer containing acidic groups), -130 (a polyamide), -161, -162, -163, -164, -165, -166 and -170 (high molecular weight copolymers), and -400, Bykumen (high molecular weight unsaturated acid esters), BYK-P104 and P105 (high molecular weight unsaturated polycarboxylic acids), P104S and 240S (high molecular weight unsaturated polycarboxylic acid and silicone), and Lactimon (a long chain amine, unsaturated polycarboxylic acid, and silicone).

(2) Products manufactured by Efka Chemicals, including Efka 44, 46, 47, 48, 49, 54, 63, 64, 65, 66, 71, 701, 764 and 766, Efka Polymer 100 (a modified polyacrylate), 150 (an aliphatic modified polymer), 400, 401, 402, 403, 450, 451, 452 and 453 (modified polyacrylates), and 745 (a copper phthalocyanine derivative).

(3) Products manufactured by Kyoeisha Chemical Co., Ltd., including Florene TG-710 (a urethane oligomer), Flonone SH-290 and SP-1000, and Polyflow No. 50E and No. 300 (acrylic copolymers).

(4) Products manufactured by Kusumoto Chemicals Ltd., including Disparlon KS-860, 873SN and 874 (high molecular weight dispersing agents), #2150 (an aliphatic polyvalent carboxylic acid), and #7004 (a polyether ester)

(5) Products manufactured by Kao Corporation, including Demol RN and N (sodium salts of naphthalenesulfonic acid-formalin condensates), MS, C and SN-B (sodium salts of aromatic sulfonic acid-formalin condensates), and EP (a polycarboxylic acid polymer), Homogenol L-18 (a polycarboxylic acid polymer), Emalgen 920, 930, 931, 935, 950 and 985 (polyoxyethylene nonylphenyl ethers), Acetamine 24 (a coconut amine acetate), and 86 (stearylamine acetate).

(6) Products manufactured by Zeneca Group, including Solsperse 5000 (a phthalocyanine ammonium salt), 13240 and 13940 (polyesteramines), 17000 (a fatty acid amine), and 24000.

(7) Products manufactured by Nikko Chemicals Co., Ltd., including Nikol T106 (a polyoxyethylene sorbitan monooleate) and MYS-IEX (a polyoxyethylene monostearate), and Hexagline 4-0 (a hexaglyceryl tetraoleate).

Specific examples of branched polymers that can be used within the acidic resin type dispersing agent include hydroxyl group-containing carboxylate esters, salts of long chain polyaminoamides and high molecular weight acid esters, salts of high molecular weight polycarboxylic acids, salts of long chain polyaminoamides and polar acid esters, high molecular weight unsaturated acid esters, high molecular weight copolymers, modified polyurethanes, modified polyacrylates, polyether ester type anionic activating agents, salts of naphthalenesulfonic acid-formalin condensates, salts of aromatic sulfonic acid-formalin condensates, polyoxyethylenealkyl phosphates, polyoxyethylene nonylphenyl ethers, and stearylamine acetate.

The surfactant as the dispersing aid includes anionic surfactants such as polyoxyethylene alkyl ether sulfate, sodium dodecylbenzenesulfonate, an alkali salt of a styrene-acrylic acid copolymer, sodium alkylnaphthalenesulfonate, sodium alkyldiphenyl ether disulfonate, monoethanolamine lauryl sulfate, triethanolamine lauryl sulfate, ammonium lauryl sulfate, monoethanolamine stearate, sodium stearate, sodium lauryl sulfate and monoethanolamine of a styrene-acrylic acid copolymer, and polyoxyethylene alkyl ether phosphate ester; nonionic surfactants such as polyoxyethylene oleyl ether, polyoxyethylene lauryl ether, polyoxyethylene nonylphenyl ether, polyoxyethylene alkyl ether phosphate ester, polyoxyethylene sorbitan monostearate and polyethylene glycol monolaurate; cationic surfactants such as a quaternary alkylammonium salt and an ethylene oxide adduct thereof; and amphoteric surfactants such as alkyl betaines such as alkyldimethylaminoacetic acid betaine and alkylimidazolines. These can be used singly or in combination.

Dye derivatives are compounds in which a basic or acidic substituent has been introduced into an organic dye structure. These organic dyes include faint yellow-colored compounds such as triazine, naphthalene, anthraquinone and acridone, which are not normally classed as dyes. Examples of suitable dye derivatives include those disclosed in Japanese Laid-Open Publication No. Sho 63-305173, Japanese Examined Patent Publication No. Sho 57-15620, Japanese Examined Patent Publication No. Sho 59-40172, Japanese Examined Patent Publication No. Sho 63-17102, Japanese Examined Patent Publication No. Hei 5-9469, and Japanese Laid-Open Publication No. Hei 9-176511 (the contents of these publications are incorporated herein by reference). These derivatives can be used singly or in combination.

Examples of the basic groups within the dye derivatives include, specifically, the substituent groups represented by the general formulas (2), (3), (4) and (5) shown below. Dye derivatives containing a basic group that includes a triazine ring, as represented by the general formula (5) below, have a particularly powerful dispersing effect on the treated pigment, and are consequently preferred.

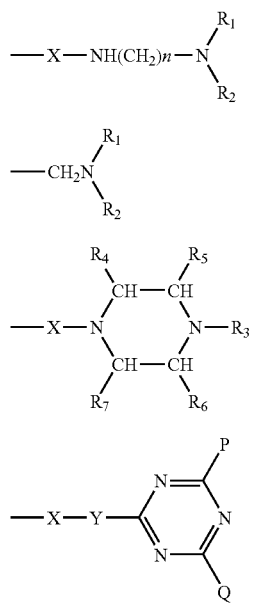

In the formulas (2) to (5);

X represents —$SO_2$—, —CO—, —$CH_2NHCOCH_2$—, —$CH_2$— or a single bond.

n represents an integer of 1 to 10.

$R_1$ and $R_2$ represent independently an unsubstituted or substituted alkyl group, an unsubstituted or substituted alkenyl group, or an unsubstituted or substituted phenyl group, or $R_1$ and $R_2$ are taken together to form an unsubstituted or substituted heterocycle containing further a nitrogen atom, an oxygen atom or a sulfur atom. The number of carbon atoms of alkyl group and alkenyl group is preferably 1 to 10.

$R_3$ represents an unsubstituted or substituted alkyl group, an unsubstituted or substituted alkenyl group, or an unsubstituted or substituted phenyl group. The number of carbon atoms of alkyl group and alkenyl group is preferably 1 to 10.

$R_4$, $R_5$, $R_6$ and $R_7$ represent independently a hydrogen atom, an unsubstituted or substituted alkyl group, an unsubstituted or substituted alkenyl group, or an unsubstituted or substituted phenyl group, respectively. The number of carbon atoms of alkyl group and alkenyl group is preferably 1 to 5.

Y represents —$NR_8$-Z-$NR_9$— or a single bond.

$R_8$ and $R_9$ represent independently a hydrogen atom, an unsubstituted or substituted alkyl group, an unsubstituted or substituted alkenyl group, or an unsubstitued or substituted phenyl group. The number of carbon atoms of alkyl group and alkenyl group is preferably 1 to 5.

Z represents an unsubstituted or substituted alkylene group, an unsubstituted or substituted alkenylene group, or an unsubstituted or substituted phenylene group. The number of carbon atoms of alkylene group and alkenylene group is preferably 1 to 8.

P represents a substituent represented by the formula (6) or (7).

Q represents a hydroxy group, an alkoxyl group, a substituent represented by the above formula (6) or (7).

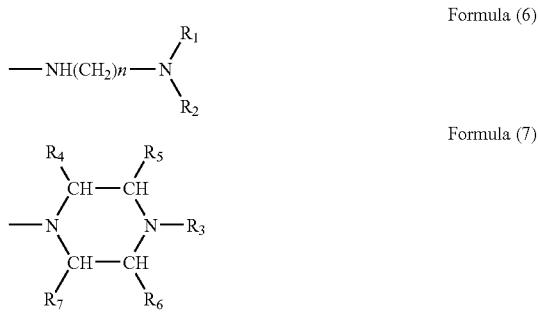

Examples of the acidic groups within the dye derivatives include, specifically, sulfonic acid groups and terephthalic acid monoamide methyl groups.

The sulfonic acid groups may form a salt with a metal such as aluminum, potassium, sodium or calcium, or with an amine. Aluminum salts of dye derivatives containing an acidic group have a particularly powerful dispersing effect on the treated pigment, and are consequently preferred.

Examples of an organic dye constituting the dye derivative include a diketopyrropyrrole pigment; an azo pigment such as a monoazo, bisazo or polyazo pigment; a phthalocyanine pigment; an anthraquinone pigment such as diaminodianthraquinone, anthrapyrimidine, flavanthrone, anthanthrone, indanthrone, pyranthrone, or violanthrone; a quinacridone pigment; a dioxazine pigment; a perynone pigment; a perylene pigment; a thioindigo pigment; an isoindoline pigment; an isoindolinone pigment; a quinophthalone pigment; a threne pigment; and a metal complex pigment.

The dye derivative having the specific basic group can be synthesized through various synthesis routes. For example, they can be obtained by introducing a substituent represented by the following formulas (8) to (11) into the organic dye, and reacting an amine component such as N,N-dimethylaminopropylamine, N-methylpiperazine, diethylamine or 4-(4-hydroxy-6-(3-(dibutylamino)propylamino)-1,3,5-triazin-2-ylamino)aniline with the substituent to form the specific basic group represented by the general formulas (2) to (5).

When the organic dye is an azo pigment, an azo pigment derivative having a basic group may be prepared by introducing the substituent represented by the general formulas (2) to (5) into a diazo component or a coupling component in advance, and thereafter, performing a coupling reaction.

Examples of the amine component used for forming the substituents represented by the general formulas (2) to (7) include dimethylamine, diethylamine, N,N-ethylisopropylamine, N,N-ethylpropylamine, N,N-methylbutylamine, N,N-methylisobutylamine, N,N-butylethylamine, N,N-tert-butylethylamine, diisopropylamine, dipropylamine, N,N-sec-butylpropylamine, dibutylamine, di-sec-butylamine, diisobutylamine, N,N-isobutyl-sec-butylamine, diamylamine, diisoamylamine, dihexylamine, di(2-ethylhexyl) amine, dioctylamine, N,N-methyloctadecylamine, didecylamine, diallylamine, N,N-ethyl-1,2-dimethylpropylamine, N,N-methylhexylamine, dioleylamine, distearylamine, N,N-dimethylaminomethylamine, N,N-dimethylaminoethylamine, N,N-dimethylaminoamylamine, N,N-dimethylaminobutylamine, N,N-diethylaminoethylamine, N,N-diethylaminopropylamine, N,N-diethylaminohexylamine, N,N-diethylaminobutylamine, N,N-diethylaminopentylamine, N,N-dipropylaminobutylamine, N,N-dibutylaminopropylamine, N,N-dibutylaminoethylamine, N,N-dibutylaminobutylamine, N,N-diisobutylaminopentylamine, N,N-methyl-laurylaminopropylamine, N,N-ethylhexylaminoethylamine, N,N-distearylaminoethylamine, N,N-dioleylaminoethylamine, N,N-distearylaminobutylamine, piperidine, 2-pipecoline, 3-pipecoline, 4-pipecoline, 2,4-lupetidine, 2,6-lupetidine, 3,5-lupetidine, 3-piperidinemethanol, pipecolinic acid, isonipecotic acid, methyl isonipecotate, ethyl isonipecotate, 2-piperidineethanol, pyrrolidine, 3-hydroxypyrrolidine, N-aminoethylpiperidine, N-aminoethyl-4-pipecoline, N-aminoethylmorphorine, N-aminopropylpiperidine, N-aminopropyl-2-pipecoline, N-aminopropyl-4-pipecoline, N-aminopropylmorphorine, N-methylpiperazine, N-butylpiperazine, N-methylhomopiperazine, 1-cyclopentylpiperazine, 1-amino-4-methylpiperazine, and 1-cyclopentylpiperazine.

Dye derivatives containing a sulfonic acid group can be produced by the action of sulfuric acid on an organic pigment.

Dye derivatives containing a terephthalic acid monoamide methyl group can be produced by chloromethylating an organic pigment, subsequently conducting an aminomethylation using a primary amine, and then conducting a monoamidation using terephthalic acid.

Suitable dye derivatives include those shown below in Table 1 and Table 2, although the present invention is not limited to the derivatives shown. These dye derivatives can be used either singly, or in combinations of two or more different derivatives.

TABLE 1

Compounds and Their Chemical Structures

A-1

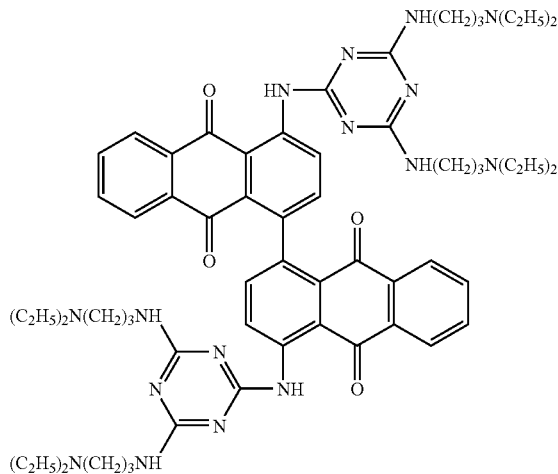

A-2

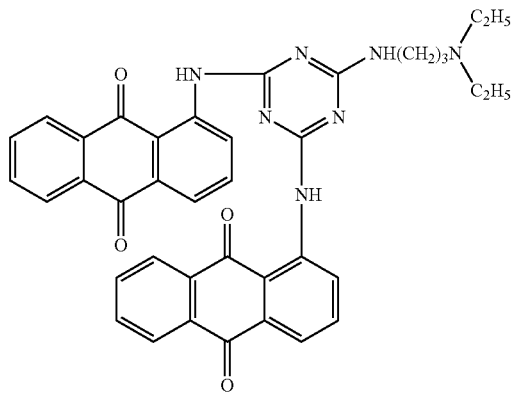

TABLE 1-continued
Compounds and Their Chemical Structures
A-3
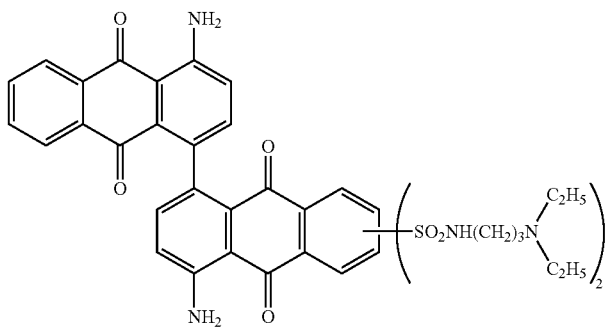
A-4
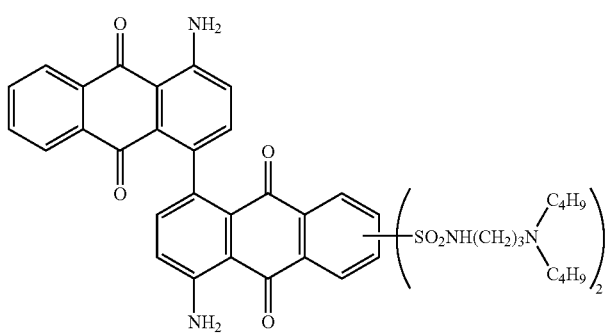
A-5
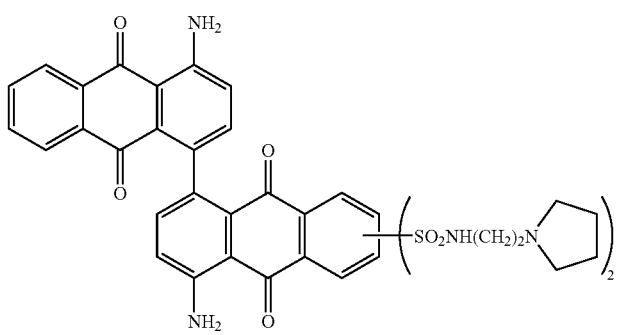
A-6
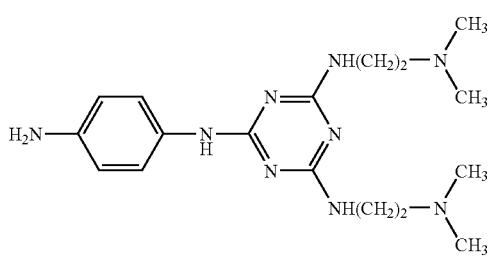
A-7
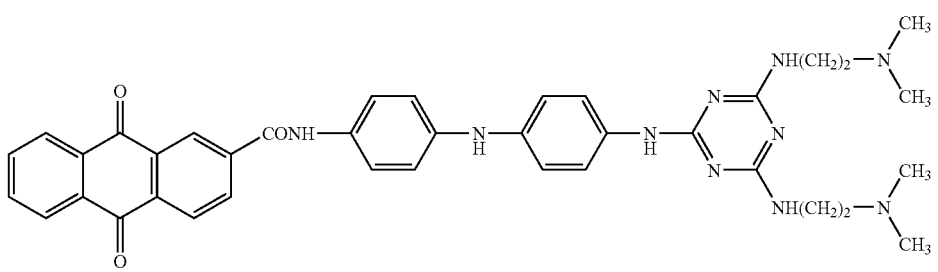

TABLE 1-continued
Compounds and Their Chemical Structures
A-8
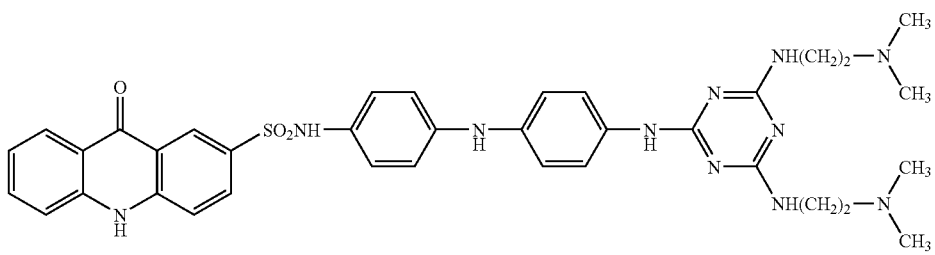
A-9
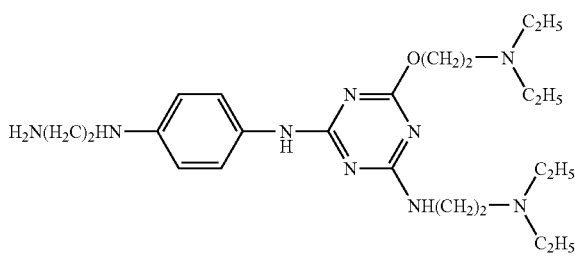
A-10
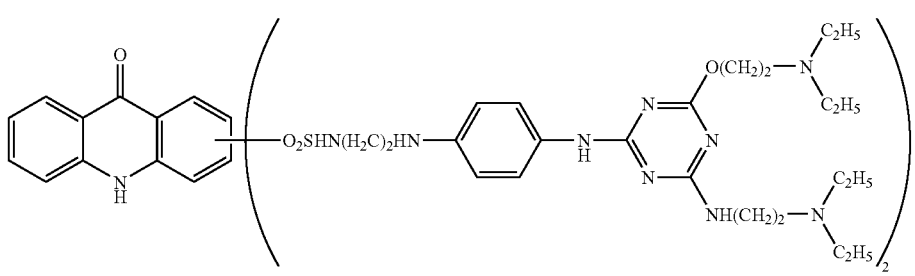
A-11
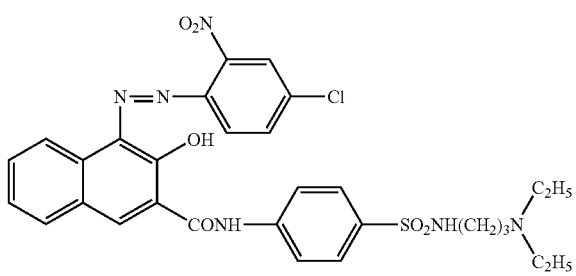
A-12
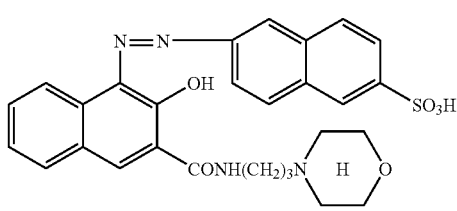
A-13
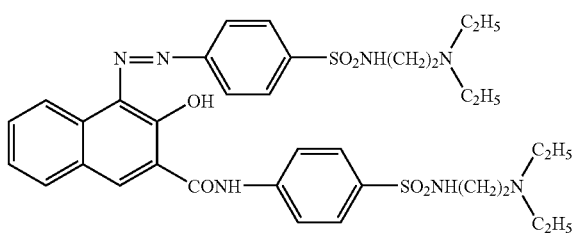

TABLE 1-continued

Compounds and Their Chemical Structures

TABLE 1-continued

Compounds and Their Chemical Structures

A-21: Chemical structure

A-22: Chemical structure

A-23: Chemical structure

A-24: Chemical structure

A-25: Chemical structure

TABLE 1-continued

Compounds and Their Chemical Structures

A-26, A-27, A-28, A-29, A-30 (chemical structures)

TABLE 1-continued
Compounds and Their Chemical Structures
A-31 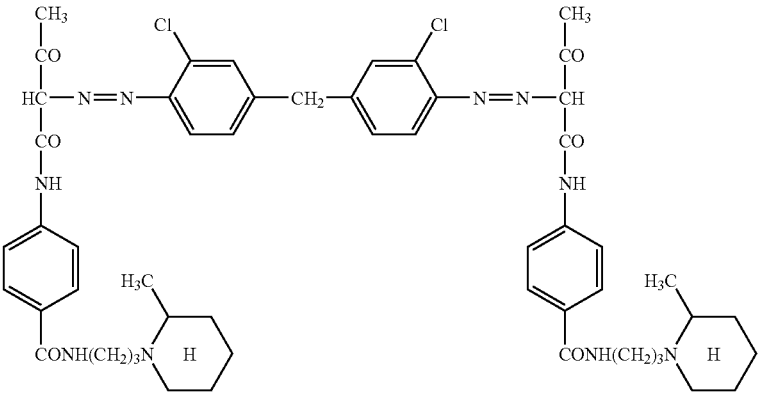
A-32 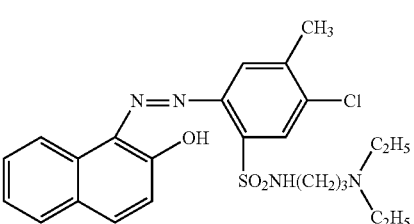
A-33 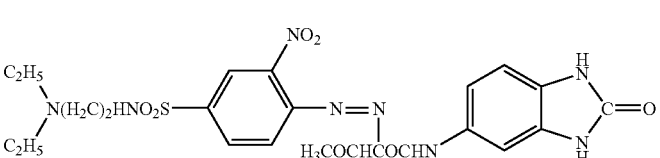
A-34 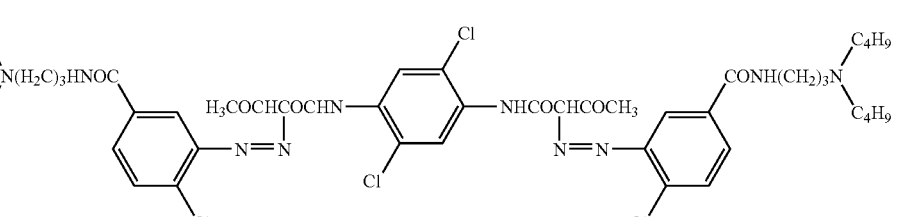
A-35 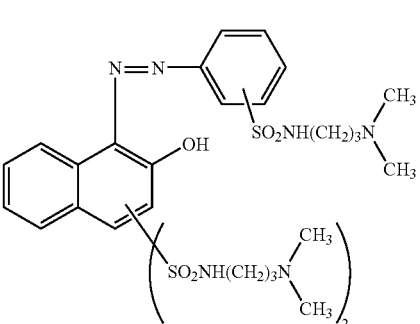
A-36 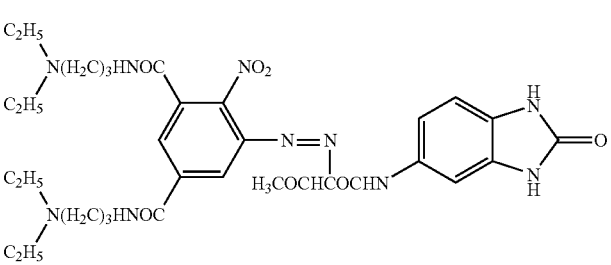

TABLE 1-continued
Compounds and Their Chemical Structures
A-37
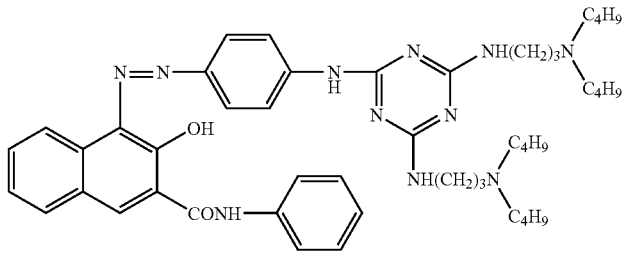
A-38
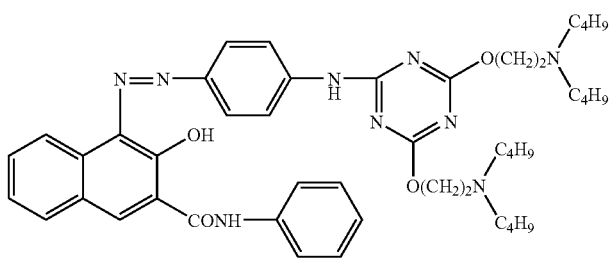
A-39
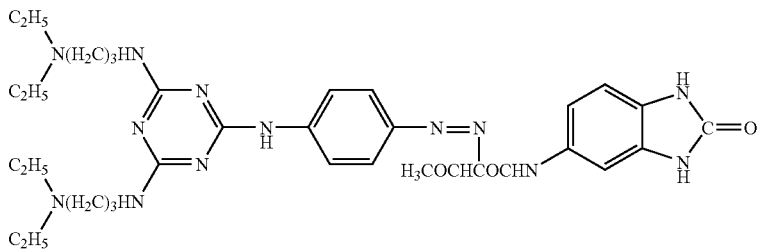
A-40
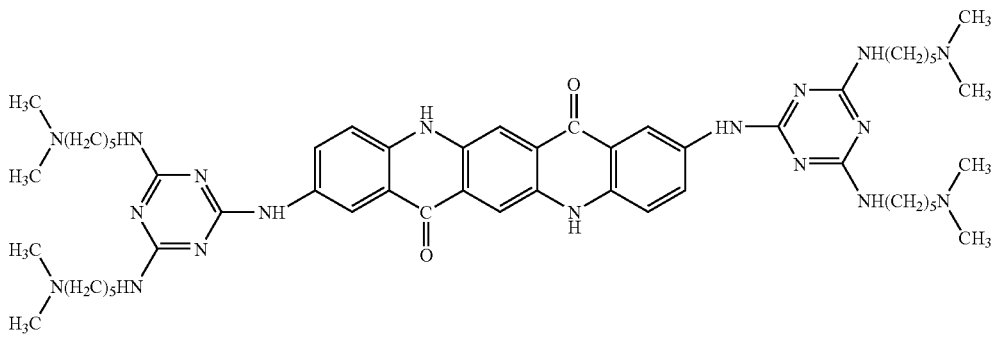
A-41
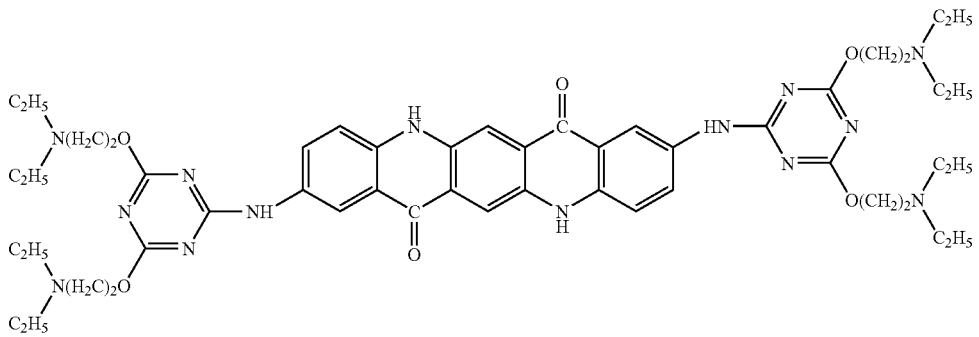

TABLE 1-continued
Compounds and Their Chemical Structures
A-42
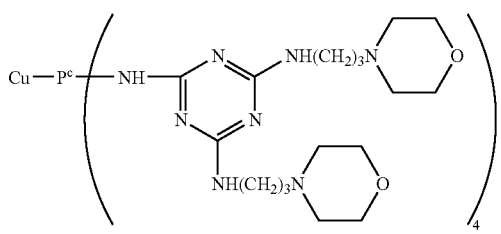
Cu—Pc: Copper phthalocyanine residue
A-43
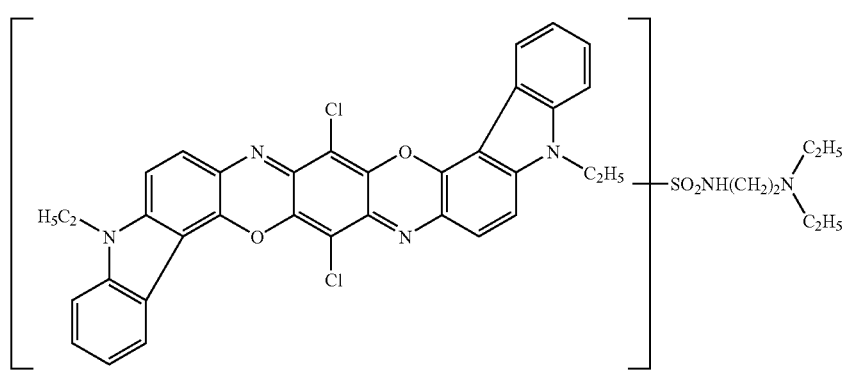
A-44
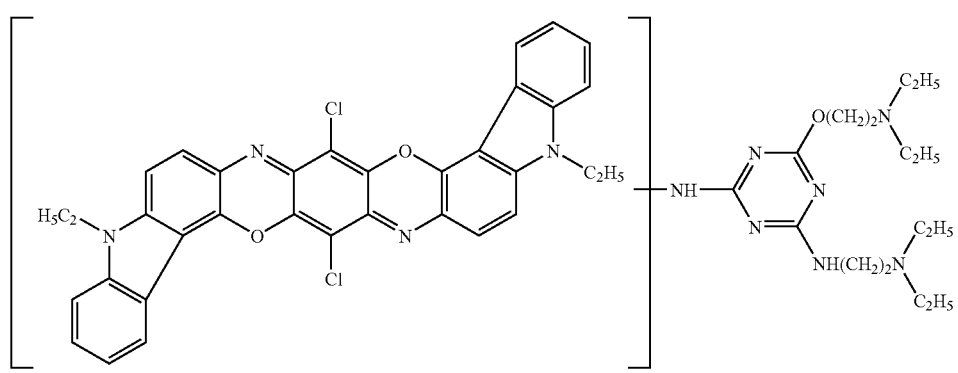
A-45
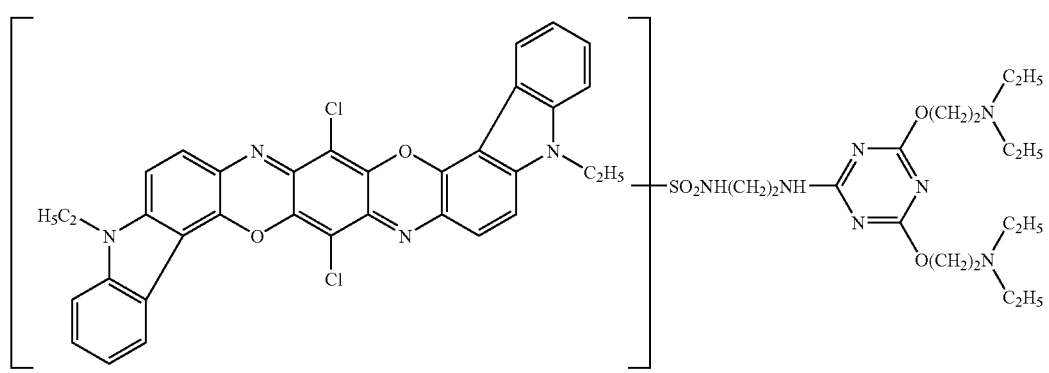

TABLE 1-continued
Compounds and Their Chemical Structures
A-46
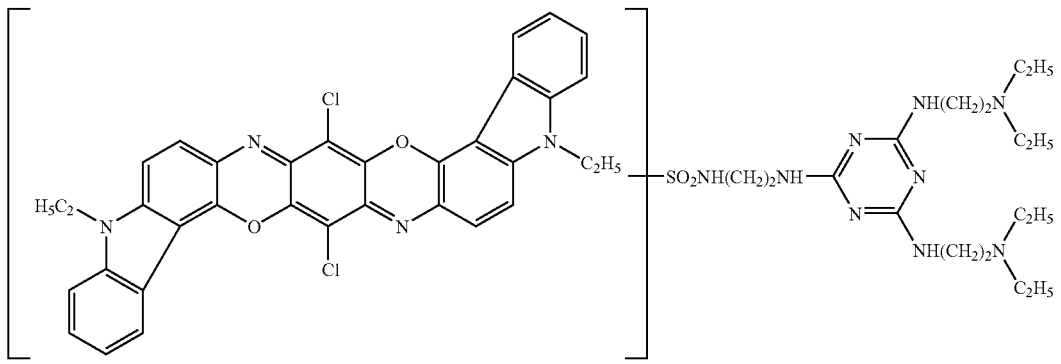
A-47
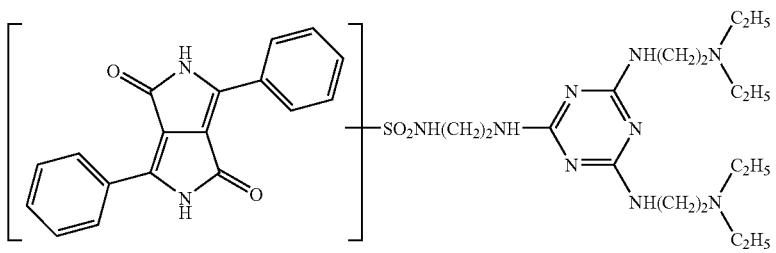
A-48
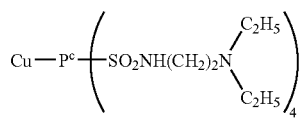
Cu—P$^c$ : Copper phthalocyanine residue
TABLE 2
Compounds and Their Chemical Structures
B-1
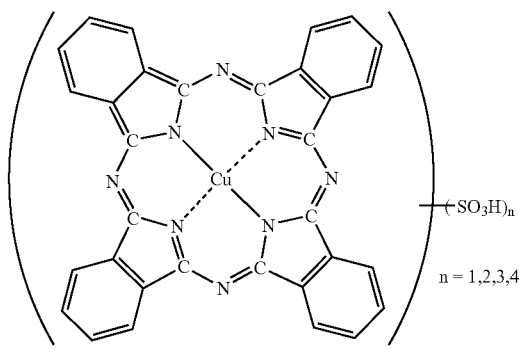
n = 1,2,3,4

TABLE 2-continued
Compounds and Their Chemical Structures
B-2
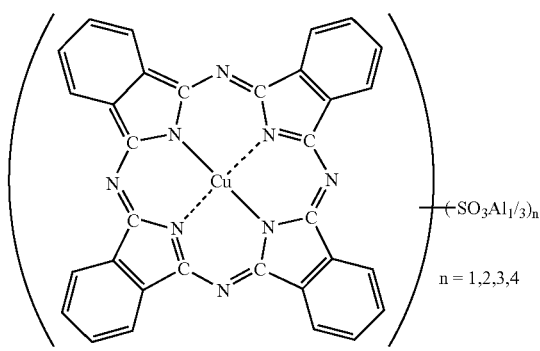
B-3
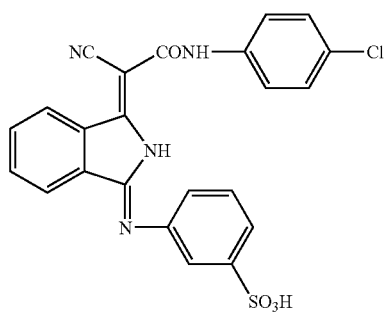
B-4
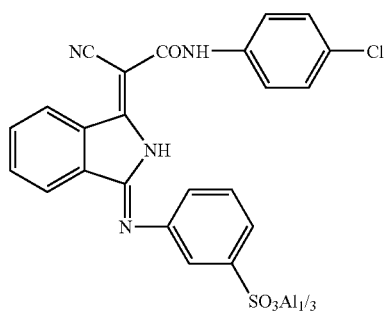
B-5
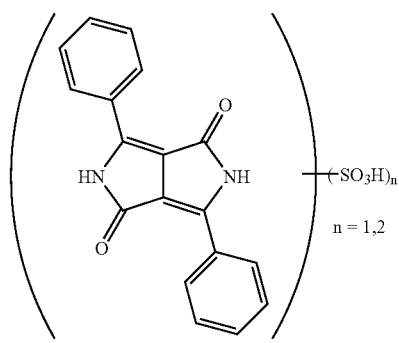

TABLE 2-continued
Compounds and Their Chemical Structures
B-6 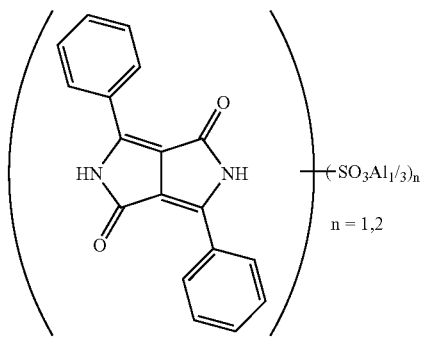
B-7 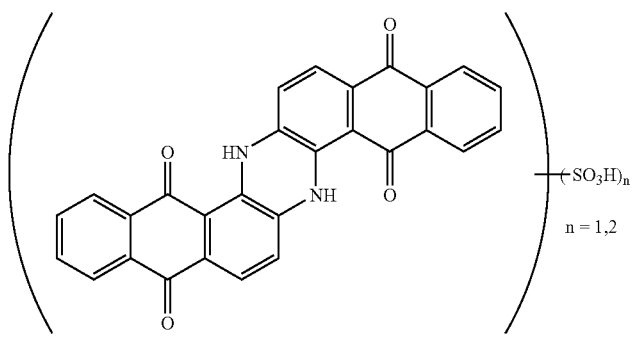
B-8 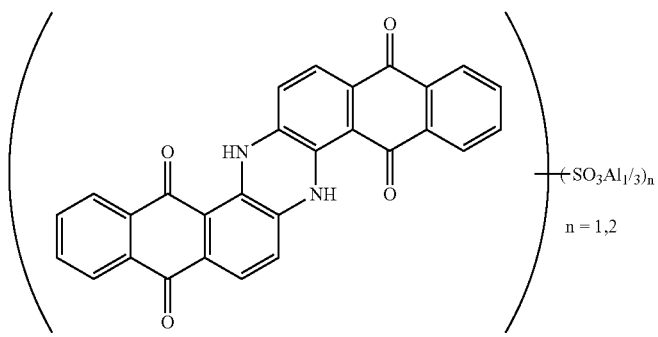
B-9 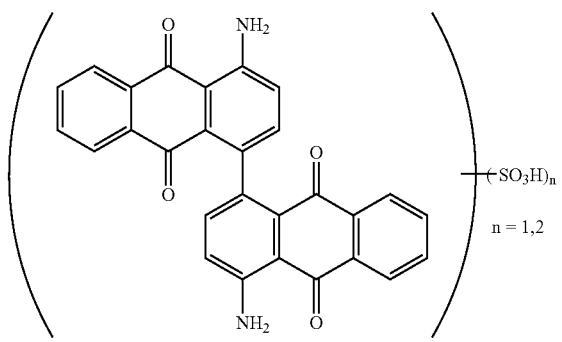

TABLE 2-continued
Compounds and Their Chemical Structures
B-10 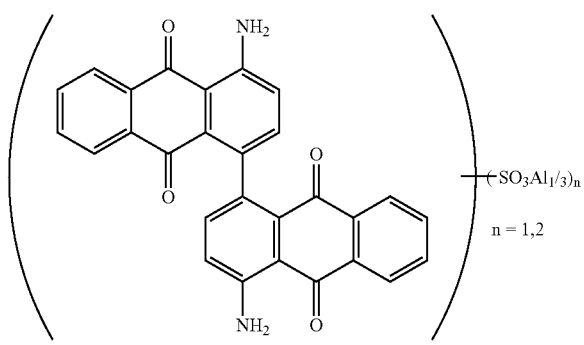
B-11 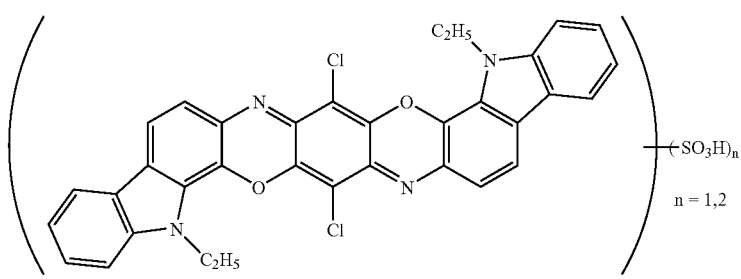
B-12 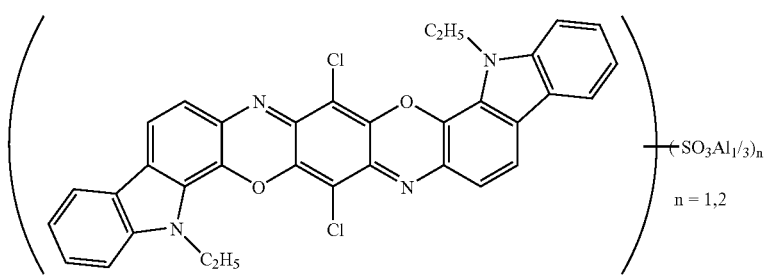
B-13 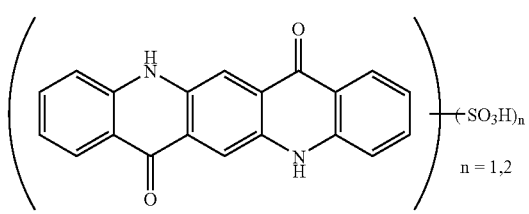
B-14 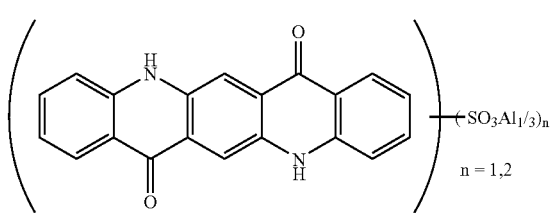

TABLE 2-continued
Compounds and Their Chemical Structures
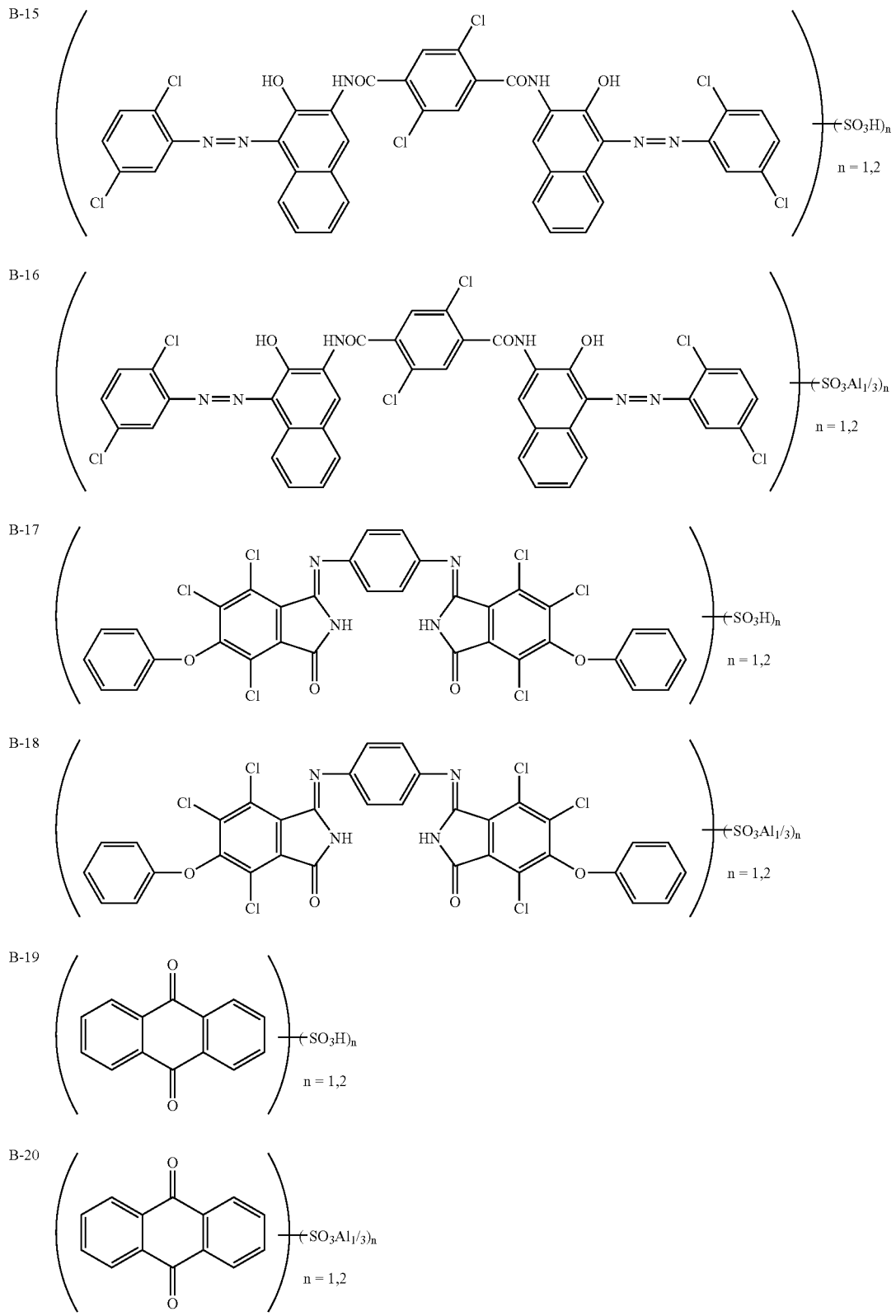

TABLE 2-continued

Compounds and Their Chemical Structures

B-21, B-22, B-23, B-24, B-25, B-26 (chemical structures)

The colored composition can contain a solvent in order to sufficiently disperse the treated pigment in the pigment carrier and facilitate coating of the composition on a transparent substrate such as glass to a thickness of 0.2 to 5 μm when dried to form a coating film. Examples of the solvent include cyclohexanone, ethylcellosolve acetate, butylcellosolve acetate, 1-methoxy-2-propyl acetate, diethylene glycol dimethyl ether, ethylbenzene, ethylene glycol diethyl ether, xylene, ethylcellosolve, methyl n-amyl ketone, propylene glycol monomethyl ether, toluene, methyl ethyl ketone, ethyl acetate, methanol, ethanol, isopropanol, butanol, isobutyl ketone, and a petroleum solvent. These can be used singly or in combination.

The solvent is preferably used in an amount of 1.2 to 20 times, and even more preferably from 3 to 10 times, the weight of the nonvolatile fraction of the colored composition.

Furthermore, the colored composition can contain a storage stabilizer for stabilizing the viscosity of the composition over time. Examples of the storage stabilizer include quaternary ammonium chlorides such as benzyltrimethyl chloride and diethylhydroxyamine, organic acids such as lactic acid and oxalic acid and methyl ether thereof, t-butylpyrocatechol, organic phosphines such as tetraethylphosphine and tetraphenylphosphine, and a salt of phosphorous acid.

The storage stabilizer is preferably used in an amount of 0.01 to 10% by weight, and even more preferably 0.5 to 5% by weight, based on the weight of the nonvolatile fraction of the colored composition.

It is preferable that large grains of 5 μm or more, preferably 1 μm or more and more preferably 0.5 μm or more and mixed dusts are removed by means of, e.g., centrifugal separation, a sintered filter or a membrane filter from the colored composition.

This colored composition can be prepared as an inkjet ink, gravure printing ink, gravure offset printing ink, waterless offset printing ink, silk screen printing ink, any of the general coating materials used for coating vehicles, timber or metals, a back coating material for magnetic tape, a radiation curable ink, or a solvent-developable or alkali-developable colored resist material.

For example, a colored resist material can be prepared by dispersing the treated pigment in a composition comprising a thermoplastic resin, a thermosetting resin or an active energy beam curable resin, together with a monomer and a photopolymerization initiator.

During development of a colored resist material, an aqueous solution of sodium carbonate or sodium hydroxide or the like is used as the alkali developing solution, and an organic alkali such as dimethylbenzylamine or triethanolamine can also be used. Additives such as antifoaming agents or surfactants can also be added to the developing solution.

In order to improve the ultraviolet exposure sensitivity, the colored resist material is first applied and dried, and a water-soluble or alkali-soluble resin such as polyvinyl alcohol or a water-soluble acrylic resin can then be applied and dried, thereby forming a film that prevents polymerization inhibition caused by oxygen, before the ultraviolet light exposure is conducted.

EXAMPLES

As follows is a description of the present invention based on a series of examples, although the present invention is in no way limited by the examples presented below. In the examples and comparative examples, the units "parts" refer to "parts by weight".

First is a description of the resin solutions and treated pigments used in the examples and comparative examples.

(Preparation of an Acrylic Resin Solution)

A reaction vessel comprising a separable four-necked flask fitted with a thermometer, a condenser, a nitrogen gas inlet and a stirring device was charged with 70.0 parts of cyclohexanone, the temperature was raised to 80° C., and following flushing of the inside of the reaction vessel with nitrogen, a mixture containing 13.3 parts of n-butyl methacrylate, 4.6 parts of 2-hydroxyethyl methacrylate, 4.3 parts of methacrylic acid, 7.4 parts of para-cumylphenol ethylene oxide-modified acrylate (Aronix M110, manufactured by Toagosei Co., Ltd.), and 0.4 parts of 2,2'-azobisisobutyronitrile was added dropwise from a dropping funnel over a two hour period. Following completion of the dropwise addition, reaction was continued for a further three hours, thereby yielding a solution of an acrylic resin with a weight average molecular weight of 26,000. Following cooling of the solution to room temperature, approximately 2 g of the resin solution was sampled, and then heated and dried at 180° C. for 20 minutes to measure the nonvolatile fraction, and the product resin solution was then subjected to either drying under reduced pressure, or the addition of cyclohexanone to adjust the nonvolatile fraction to 20% by weight, thus completing preparation of the acrylic resin solution.

(Preparation of a Polyimide Resin Solution)

A reaction vessel was charged with 210.2 parts of 4,4'-diaminodiphenyl ether, 69.5 parts of 3,3'-diaminodiphenyl sulfone and 17.4 parts of bis(3-aminopropyl)tetramethyldisiloxane, together with 2,700 parts of γ-butyrolactone, and with the resulting mixture undergoing constant stirring, 225.5 parts of 3,3',4,4'-benzophenonetetracarboxylic dianhydride and 149.6 parts of pyromellitic dianhydride were added to the reaction vessel, and the mixture was then reacted at 60° C. for three hours. Subsequently, 2.75 parts of maleic anhydride was added, the reaction was continued at 60° C. for a further one hour, and following cooling to room temperature, approximately 2 g of the resin solution was sampled, and heated and dried at 180° C. for 20 minutes to measure the nonvolatile fraction, and the product resin solution was then subjected to either drying under reduced pressure, or the addition of NMP (N-methylpyrrolidone) to adjust the nonvolatile fraction to 20% by weight, thus completing preparation of the polyimide resin solution.

(Preparation of an Epoxy Acrylate Resin Solution)

38 parts of tetramethylbisphenol diglycidyl ether (YX400, manufactured by Yuka Shell Epoxy Co., Ltd., epoxy equivalence: 190) and 14.4 parts of acrylic acid were dissolved at 60° C., 0.19 parts of triphenylphosphine and 0.019 parts of hydroquinone methyl ether were added, and the resulting mixture was heated to 100° C. and stirred for 10 hours. The acid value was measured during the reaction, and when the acid value reached 2 mgKOH/g the mixture was cooled to 60° C. Following cooling to room temperature, approximately 2 g of the resin solution was sampled, and heated and dried at 180° C. for 20 minutes to measure the nonvolatile fraction, and the product resin solution was then subjected to the addition of cyclohexanone to adjust the nonvolatile fraction to 20% by weight, thus completing preparation of the epoxy acrylate resin solution.

(Preparation of a Vinyl Resin Solution)

A four-necked flask fitted with a temperature controller, a stirring device, a cooling condenser and a dropping funnel was charged with 45 parts of a phenolic resin with a dicyclopentadiene structure (DPP-3H, manufactured by Nippon Petrochemicals Co., Ltd.), 38.1 parts of vinylbenzyl chloride (CMS-AM, manufactured by Seimi Chemical Co., Ltd.), 2.4 parts of tetra-n-butylammonium bromide, 0.038 parts of 2,4-dinitrophenol and 200 parts of methyl ethyl ketone, and following dissolution by stirring, 40 parts of a 50% by weight NaOH aqueous solution was added at 75° C. over a 20 minute period, and the resulting mixture was then reacted at 75° C. for 4 hours. Subsequently, the contents of the flask were neutralized with 2N hydrochloric acid, and following the addition of 100 parts of toluene, the organic layer was washed three times with distilled water. Following subsequent removal of the methyl ethyl ketone under reduced pressure, the reaction product was precipitated in methanol, and the solid fraction was collected by filtration and dried under vacuum at 50° C., yielding a vinyl resin. Following cooling to room temperature, sufficient cyclohexanone was added to dissolve the vinyl resin and adjust the nonvolatile fraction to 20% by weight, thus completing preparation of the vinyl resin solution.

(Synthesis of Halogenated Phthalocyanine Pigment)

Using crude phthalocyanine in which the central metal was copper, aluminum, zinc or cobalt as a raw material, halogenation was conducted using a conventional method, thereby synthesizing a halogenated phthalocyanine pigment with a central metal of copper, aluminum, zinc or cobalt.

(Preparation of a Treated Phthalocyanine Green Pigment 1)

A stainless steel one gallon kneader (manufactured by Inoue Manufacturing Co., Ltd.) was charged with 500 parts of a halogenated copper phthalocyanine pigment, 500 parts of sodium chloride, 250 parts of diethylene glycol and 50 parts of oleic acid, and the resulting mixture was kneaded at 120° C. for two hours. Subsequently, the resulting kneaded material was poured into 5 liters of hot water, the mixture was stirred under heat at 70° C. for one hour to generate a slurry, and following repeated filtering and washing with water to remove the sodium chloride and diethylene glycol, the product was dried at 80° C. for a full day, thus yielding a treated phthalocyanine green pigment 1.

(Preparation of a Treated Phthalocyanine Green Pigment 2)

With the exception of replacing the halogenated copper phthalocyanine pigment with a halogenated aluminum phthalocyanine green, a treated phthalocyanine green pigment 2 was produced in the same manner as the treated phthalocyanine green pigment 1.

(Preparation of a Treated Phthalocyanine Green Pigment 3)

With the exception of replacing the halogenated copper phthalocyanine pigment with a halogenated zinc phthalocyanine green, a treated phthalocyanine green pigment 3 was produced in the same manner as the treated phthalocyanine green pigment 1.

(Preparation of a Treated Phthalocyanine Green Pigment 4)

With the exception of replacing the halogenated copper phthalocyanine pigment with a halogenated cobalt phthalocyanine green, a treated phthalocyanine green pigment 4 was produced in the same manner as the treated phthalocyanine green pigment 1.

(Preparation of a Treated Phthalocyanine Green Pigment 5)

With the exception of replacing the oleic acid with stearic acid, a treated phthalocyanine green pigment 5 was produced in the same manner as the treated phthalocyanine green pigment 1.

(Preparation of a Treated Phthalocyanine Green Pigment 6)

With the exception of replacing the oleic acid with linoleic acid, a treated phthalocyanine green pigment 6 was produced in the same manner as the treated phthalocyanine green pigment 1.

(Preparation of a Treated Phthalocyanine Green Pigment 7)

With the exception of altering the quantity of oleic acid used from 50 parts to 10 parts, a treated phthalocyanine green pigment 7 was produced in the same manner as the treated phthalocyanine green pigment 1.

(Preparation of a Treated Phthalocyanine Green Pigment 8)

With the exception of altering the quantity of oleic acid used from 50 parts to 75 parts, a treated phthalocyanine green pigment 8 was produced in the same manner as the treated phthalocyanine green pigment 1.

(Preparation of a Treated Phthalocyanine Green Pigment 9)

With the exception of altering the quantity of oleic acid used from 50 parts to 5 parts, a treated phthalocyanine green pigment 9 was produced in the same manner as the treated phthalocyanine green pigment 1.

(Preparation of a Treated Phthalocyanine Green Pigment 10)

With the exception of altering the quantity of oleic acid used from 50 parts to 100 parts, a treated phthalocyanine green pigment 10 was produced in the same manner as the treated phthalocyanine green pigment 1.

Example 1

A mixture with the composition shown below was stirred to generate a uniform mixture, which was then dispersed for 5 hours in an Eiger mill using zirconia beads of diameter 0.5 mm, and then filtered through a filter of 5 µm, thus yielding a pigment dispersion.

| | |
|---|---|
| treated phthalocyanine green pigment 1 | 13.5 parts |
| dye derivative (a compound A-42 shown in Table 1) | 1.5 parts |
| acrylic resin solution | 40.0 parts |
| trimethylolpropane triacrylate (NK ester ATMPT, manufactured by Shin-Nakamura Chemical Co., Ltd.) | 7.0 parts |
| cyclohexanone | 38.0 parts |

Subsequently, a mixture with the composition shown below was stirred to generate a uniform mixture, and this mixture was then filtered through a 1 µm filter, thus yielding a colored composition.

| | |
|---|---|
| the above pigment dispersion | 53.33 parts |
| acrylic resin solution | 7.75 parts |
| photopolymerization initiator (Irgacure 907, manufactured by Ciba Speciality Chemicals Co.) | 2.24 parts |
| surfactant (BYK-323, manufactured by BYK Chemie) | 0.03 parts |
| storage stabilizer (TPP, manufactured by Hokko Chemical Industry Co., Ltd.) | 0.20 parts |
| cyclohexanone | 36.45 parts |

Example 2

With the exception of replacing the treated phthalocyanine green pigment 1 with the treated phthalocyanine green pigment 2, a colored composition was obtained in the same manner as the example 1.

Example 3

With the exception of replacing the treated phthalocyanine green pigment 1 with the treated phthalocyanine green pigment 3, a colored composition was obtained in the same manner as the example 1.

Example 4

With the exception of replacing the treated phthalocyanine green pigment 1 with the treated phthalocyanine green pigment 4, a colored composition was obtained in the same manner as the example 1.

Example 5

With the exception of replacing the treated phthalocyanine green pigment 1 with the treated phthalocyanine green pigment 5, a colored composition was obtained in the same manner as the example 1.

Example 6

With the exception of replacing the treated phthalocyanine green pigment 1 with the treated phthalocyanine green pigment 6, a colored composition was obtained in the same manner as the example 1.

Example 7

With the exceptions of replacing the 13.5 parts of the treated phthalocyanine green pigment 1 with 12.27 parts of the treated phthalocyanine green pigment 7, altering the quantity of the acrylic resin solution from 40.0 parts to 46.14 parts, and altering the quantity of cyclohexanone from 38.0 parts to 33.1 parts, a pigment dispersion was prepared, and a colored composition obtained, in the same manner as the example 1.

Example 8

With the exceptions of replacing the 13.5 parts of the treated phthalocyanine green pigment 1 with 14.15 parts of the treated phthalocyanine green pigment 8, altering the quantity of the acrylic resin solution from 40.0 parts to 38.1 parts, and altering the quantity of cyclohexanone from 38.0 parts to 39.25 parts, a pigment dispersion was prepared, and a colored composition obtained, in the same manner as the example 1.

Example 9

With the exception of altering the dye derivative from the compound A-42 to a compound A-48 shown in Table 1, a colored composition was obtained in the same manner as the example 1.

Example 10

With the exception of altering the dye derivative from the compound A-42 to a compound B-1 shown in Table 2, a colored composition was obtained in the same manner as the example 1.

Example 11

With the exception of altering the dye derivative from the compound A-42 to a compound B-2 shown in Table 2, a colored composition was obtained in the same manner as the example 1.

Example 12

With the exceptions of replacing the acrylic resin solution with the polyimide resin solution, and replacing the cyclohexanone with NMP (N-methylpyrrolidone), a colored composition was obtained in the same manner as the example 1.

Example 13

With the exception of replacing the acrylic resin solution with the epoxy acrylate resin solution, a colored composition was obtained in the same manner as the example 1.

Example 14

With the exception of replacing the acrylic resin solution with the vinyl resin solution, a colored composition was obtained in the same manner as the example 1.

Example 15

With the exceptions of replacing the 13.5 parts of the treated phthalocyanine green pigment 1 with 14.15 parts of the treated phthalocyanine green pigment 9, altering the quantity of the acrylic resin solution from 40.0 parts to 38.1 parts, and altering the quantity of cyclohexanone from 38.0 parts to 39.25 parts, a pigment dispersion was prepared, and a colored composition obtained, in the same manner as the example 1.

Example 16

With the exceptions of replacing the 13.5 parts of the treated phthalocyanine green pigment 1 with 15.19 parts of the treated phthalocyanine green pigment 10, altering the quantity of the acrylic resin solution from 40.0 parts to 31.56 parts, and altering the quantity of cyclohexanone from 38.0 parts to 44.75 parts, a pigment dispersion was prepared, and a colored composition obtained, in the same manner as the example 1.

Comparative Example 1

With the exception of replacing the treated phthalocyanine green pigment 1 with an untreated C.I. Pigment Green 36 pigment (Lionol Green 6YK, manufactured by Toyo Ink Manufacturing. Co., Ltd.), a colored composition was obtained in the same manner as the example 1.

Comparative Example 2

With the exception of replacing the treated phthalocyanine green pigment 1 with an untreated C.I. Pigment Green 36 pigment (Lionol Green 2YS, manufactured by Toyo Ink Manufacturing. Co., Ltd.), a colored composition was obtained in the same manner as the example 1.

Using the methods described below, the colored compositions obtained in the above examples and comparative examples were evaluated for dispersibility (uniformity of coating, and storage stability). In addition, each of the colored compositions was used to prepare a coating film using the method described below, and the coating film was then evaluated for adhesion, variation in dielectric loss tangent, and chargeability. The results are shown in table 3.

TABLE 3

| | Dispersibility evaluation | | Coating film evaluation | Evaluation of variation in dielectric loss tangent | | Chargeability evaluation |
|---|---|---|---|---|---|---|
| | Uniformity of coating | Storage stability | Adhesion | 10 Hz | 50 Hz | 50 Hz |
| Example 1 | A | A | A | 0.00 | 0.00 | 91% |
| Example 2 | A | A | A | 0.01 | 0.01 | 88% |
| Example 3 | A | B | A | 0.03 | 0.02 | 85% |
| Example 4 | A | B | A | 0.03 | 0.02 | 84% |
| Example 5 | C | C | B | 0.03 | 0.02 | 83% |
| Example 6 | C | C | B | 0.03 | 0.02 | 83% |
| Example 7 | A | B | B | 0.06 | 0.04 | 73% |
| Example 8 | A | A | C | 0.00 | 0.00 | 90% |
| Example 9 | C | C | B | 0.04 | 0.03 | 80% |
| Example 10 | C | C | B | 0.05 | 0.03 | 75% |
| Example 11 | A | A | B | 0.01 | 0.00 | 89% |
| Example 12 | B | B | B | 0.04 | 0.01 | 81% |
| Example 13 | B | B | B | 0.04 | 0.01 | 82% |
| Example 14 | B | B | B | 0.04 | 0.01 | 80% |
| Example 15 | A | B | B | 0.12 | 0.05 | 63% |
| Example 16 | A | A | D | 0.00 | 0.00 | 92% |
| Comparative example 1 | A | B | A | 0.12 | 0.06 | 60% |
| Comparative example 2 | B | B | A | 0.16 | 0.10 | 50% |

(1) Dispersibility Evaluation

The viscosity of each colored composition prior to, and then following, standing for 7 days at 40° C. was measured at 25° C. using an E-type viscometer (R110, manufactured by Toki Sangyo Co., Ltd.). The storage stability was evaluated as A if the variation in the viscosity following standing for 7 days at 40° C. was less than 10%, B if the variation was at least 10% but less than 20%, C if the variation was at least 20% but less than 50%, and D if the variation was 50% or greater.

Furthermore, each of the obtained colored compositions was spin coated onto a 0.7 mm thick substrate of dimensions 360 mm×465 mm, in sufficient quantity to generate an average film thickness of 1.5 μm, and following drying at 70° C. for 30 minutes, the film thickness at the center of the substrate (termed X) and the average value of the film thickness (termed Y) at four points on diagonal lines 200 mm from the center were measured. The uniformity of coating was evaluated as A if the value calculated using the formula below was less than 1%, B if the value was at least 1% but less than 2%, C if the value was at least 2% but less than 5%, and D if the value was 5% or greater.

$(X-Y) \times 100 / \{(X+Y)/2\}$ (%)

(2) Evaluation of Coating Adhesion

Each colored composition was applied to a printed circuit board (FR-4, minimum circuit width: 0.1 mm (4 patterns between pins), and a prebake was then conducted in a hot-air oven at 80° C. for 30 minutes. A silver salt film was then adhered to the coating film as a mask, and the coating film was exposed with an exposure intensity of 35 mW/cm² (at a wavelength of 365 nm) and an exposure dose of 200 mJ/cm² using an exposure device HMW680GW (which employs two 7 kW metal halide lamps) manufactured by Orc Manufacturing Co., Ltd. Subsequently, developing was conducted by spraying a 1% aqueous solution of sodium carbonate with a liquid temperature of 30° C. onto the coating film for 60 seconds using a spray pressure of 3 kg/cm², and following subsequent shower washing with water for 30 seconds, post curing was conducted using a conveyor type UV irradiation device under conditions including an irradiation dose of 1,000 mJ/cm².

The entire surface of the coating film was then coated with a high-activity water-soluble flux (K-183, manufactured by Alpha Metals Co., Ltd.), and following removal of excess flux by allowing the substrate to stand vertically for three minutes, the substrate was preheated at 130° C. for one minute, and then immersed in a 260° C. molten solder bath for 20 seconds. The substrate was allowed to cool for one minute, washed with water, and then wiped carefully to remove any water droplets. Following treatment, a cellophane tape peel test was conducted at the location of the minimum circuit width. The evaluation criteria are shown below.

A: No peeling in cellophane tape peel test

B: Peeling of narrow wire portions or edge portions in cellophane tape peel test (less than 20%)

C: Peeling of narrow wire portions or edge portions in cellophane tape peel test (at least 20%)

D: Major peeling of narrow wire portions and thick wire portions in cellophane tape peel test (3) Evaluation of Variation in Dielectric Loss Tangent of Coating Film Each colored composition was applied to the surface of a 1.1 mm thick glass substrate of dimensions 100 mm×100 mm that had been subjected to aluminum vapor deposition to form an electrode, with the composition application conducted using a spin coater at a speed of revolution sufficient to form a film of thickness 2.0 μm, thus yielding a coated substrate. Subsequently, the coating film was dried under reduced pressure, and was then subjected to ultraviolet light exposure using an ultra high pressure mercury lamp under conditions including an accumulated light intensity of 300 mJ and an illumination intensity of 30 mW. Following alkali developing, the coated substrate was heated at 230° C. for one hour, allowed to cool, and then aluminum for an electrode with a surface area of 3.464×10⁻⁴ m² was vapor deposited onto the surface of the cured coating film, thus completing preparation of a sample in which the cured coating film was sandwiched between two aluminum electrodes. The dielectric loss tangent between 10 Hz and 1 MHz for the thus obtained sample was measured at an applied voltage of 100 mV using an impedance analyzer (model 1260, manufactured by Solartron Group Ltd.), and the variation in the dielectric loss tangent was then calculated.

The variation in dielectric loss tangent was calculated by subtracting the lowest value for tan δ within the range from 100 Hz to 1 MHz from the values for tan δ at 10 Hz and 50 Hz respectively.

(4) Evaluation of Coating Film Chargeability

Using a sample prepared in the same manner as that described for the evaluation of the variation in the dielectric loss tangent for the coating film, the chargeability of the coating film was measured under conditions including an applied voltage of 100 mV, using an electrical properties measurement system (model VHR-1A, manufactured by Solartron Group Ltd.).

The chargeability of the coating film represents, as a percentage, the degree to which the coating film is able to retain an applied voltage, when a certain voltage is applied to the cured coating film for 60 μsec, and then held for a period of 19.94 msec (corresponding with 50 Hz).

As shown in Table 3, the cured coating films formed from the colored compositions of the examples 1 to 16 that used a treated pigment exhibited lower values of tan δ at 10 Hz and 50 Hz than the colored compositions of the comparative examples that used an untreated pigment, resulting in a more favorable variation in the dielectric loss tangent. In addition, the cured coating films formed from the colored compositions of the examples 1 to 16 exhibited a high chargeability at 50 Hz, indicating that a cured coating film with favorable electrical properties had been formed in each case.

The cured coating films formed from the colored compositions of the examples 1 and 2, which used a treated pigment in which the central metal of the halogenated phthalocyanine pigment was either copper or aluminum, exhibited particularly superior values for the dielectric loss tangent variation and the chargeability when compared with the cured coating films formed from the colored compositions of the examples 3 and 4, which used a treated pigment in which the central metal of the halogenated phthalocyanine pigment was either zinc or cobalt.

Moreover, the cured coating film formed from the colored composition of the example 1, which used a halogenated copper phthalocyanine pigment that had been treated with oleic acid, exhibited particularly superior values for the dielectric loss tangent variation and the chargeability when compared with the cured coating films formed from the colored compositions of the examples 5 and 6, which used halogenated copper phthalocyanine pigments that had been treated with the same quantity of either stearic acid or linoleic acid.

In terms of the treatment quantity of the higher fatty acid, the colored compositions of the examples 8 and 16, which used a treated pigment in which this treatment quantity exceeded the ideal range upper limit of 10 parts of the higher fatty acid per 100 parts of the halogenated phthalocyanine pigment, suffered a deterioration in the coating adhesion. In particular, in the colored composition of the example 16, which used a treated pigment in which the higher fatty acid treatment quantity was 20 parts per 100 parts of the halogenated phthalocyanine pigment, a quantity which exceeds even the preferred range upper limit, the coating adhesion deteriorated to the extent that peeling occurred across the entire surface.

On the other hand, the cured coating films formed from the colored compositions of the examples 7 and 15, which used a treated pigment in which the higher fatty acid treatment quantity was less than the ideal range lower limit of 3 parts of the higher fatty acid per 100 parts of the halogenated phthalocyanine pigment, exhibited inferior values for the dielectric loss tangent variation and the chargeability when compared with the cured coating film formed from the colored composition of the example 1 that used a treated pigment for which the higher fatty acid treatment quantity fell within the ideal range.

In terms of the dye derivative, the colored composition of the example 1, in which the treated pigment was dispersed using a dye derivative containing a basic group comprising a triazine ring, exhibited more favorable levels of uniformity of coating and storage stability than the colored composition of the example 9, in which the treated pigment was dispersed using a dye derivative containing a basic group which did not include a triazine ring. Furthermore, the colored composition of the example 11, in which the treated pigment was dispersed using an aluminum salt of a dye derivative containing a sulfonic acid group, exhibited more favorable levels of uniformity of coating and storage stability than the colored composition of the example 10, in which the treated pigment was dispersed using a dye derivative containing a sulfonic acid group (which did not exist as a salt).

In addition, the cured coating film formed from the colored composition of the example 1, in which the pigment carrier was an acrylic resin, exhibited more favorable values for the dielectric loss tangent variation and the chargeability than the cured coating films formed from the colored compositions of the examples 12 through 14, in which the pigment carrier used a resin other than an acrylic resin.

Next, actual usable circuits were formed on printed circuit boards that had been coated with the colored compositions using the same method as that described for the evaluation of coating adhesion, and each of these circuits was then operated continuously for 500 hours, and then evaluated for heat generation caused by electrical loss. The results revealed that for the printed circuit boards that had been coated with the colored compositions of the examples 1 through 14, electrical loss within the actual circuits was minimal, and no heat generation was observed. However, in the printed circuit boards that had been coated with the colored compositions of the comparative examples 1 and 2, the electrical loss was large, and because this loss is converted into thermal energy, heat generation was also noticeable.

As is evident from the above results, a coating film formed from a colored composition according to the present invention exhibits excellent electrical properties, with particularly minimal electrical loss. In addition, this colored composition also exhibits favorable storage stability, meaning it can be used as an electrically superior material in a wide variety of applications, including various coating agents, ultraviolet curable coating films, resists, and build-up wiring board materials.

It is to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A colored composition, comprising a pigment carrier, formed from a transparent resin, its precursor or a mixture thereof, and a halogenated phthalocyanine pigment that has been coated with a higher fatty acid.

2. The colored composition according to claim 1, wherein the higher fatty acid is oleic acid.

3. The colored composition according to claim 1, wherein a quantity of the halogenated phthalocyanine pigment that has been coated with the higher fatty acid within a range from 30 to 70% by weight based on the weight of a nonvolatile fraction of the colored composition.

4. The colored composition according to claim 1, further comprising a dye derivative having a basic group, and/or a dye derivative having an acidic group or a salt thereof.

5. The colored composition according to claim 4, wherein the dye derivative having a basic group is a compound that comprises a triazine ring.

6. The colored composition according to claim 4, wherein the dye derivative having an acidic group is an aluminum salt of a dye derivative having an acidic group.

7. A colored composition, comprising a pigment carrier, formed from a transparent resin, its precursor or a mixture thereof, and a halogenated phthalocyanine pigment that has been coated with at least one C16 to C18 fatty acid.

8. The colored composition according to claim 7, wherein the fatty acid is at least one of the group consisting of palmitic acid, stearic acid, oleic acid, linoleic acid, and linolenic acid.

9. The colored composition according to claim 7, wherein a quantity of the halogenated phthalocyanine pigment that has been coated with the fatty acid is within a range from 30 to 70% by weight based on the weight of a nonvolatile fraction of the colored composition.

10. The colored composition according to claim 7, further comprising a dye derivative having a basic group, and/or a dye derivative having an acidic group or a salt thereof.

11. The colored composition according to claim 10, wherein the dye derivative having a basic group is a compound that comprises a triazine ring.

12. The colored composition according to claim 10, wherein the dye derivative having an acidic group is an aluminum salt of a dye derivative having an acidic group.

* * * * *